United States Patent
Watanabe

(10) Patent No.: US 7,740,486 B2
(45) Date of Patent: *Jun. 22, 2010

(54) PRINTED CIRCUIT BOARD CONNECTION

(75) Inventor: Nagahisa Watanabe, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/152,542

(22) Filed: May 14, 2008

(65) Prior Publication Data

US 2008/0227313 A1 Sep. 18, 2008

Related U.S. Application Data

(63) Continuation of application No. 11/432,132, filed on May 11, 2006, now Pat. No. 7,387,515.

(30) Foreign Application Priority Data

May 11, 2005 (JP) ............................. 2005-138698

(51) Int. Cl.
*H01R 12/00* (2006.01)
(52) U.S. Cl. ............................. 439/55; 439/59; 439/65; 439/67; 439/493
(58) Field of Classification Search .................. 439/55, 439/59, 61, 65, 67, 493
See application file for complete search history.

(56) References Cited

U.S. PATENT DOCUMENTS

| | | | |
|---|---|---|---|
| 3,816,818 A | | 6/1974 | Meier |
| 3,964,087 A | * | 6/1976 | Mallon ........................ 338/306 |
| 4,423,467 A | * | 12/1983 | Shaheen ....................... 361/767 |
| 5,470,238 A | * | 11/1995 | Walden ......................... 439/98 |
| 6,118,665 A | | 9/2000 | Kishida et al. |
| 6,858,921 B2 | | 2/2005 | Kashiwagi et al. |
| 6,960,094 B2 | | 11/2005 | Tomonari et al. |
| 2002/0045382 A1 | * | 4/2002 | Takahashi ..................... 439/499 |
| 2003/0131472 A1 | * | 7/2003 | Cheng et al. ................... 29/840 |
| 2004/0157482 A1 | | 8/2004 | Tomonari et al. |

FOREIGN PATENT DOCUMENTS

| | | |
|---|---|---|
| JP | 04-123093 | 4/1992 |
| JP | 2001-351703 | 12/2001 |
| JP | 2003-317830 | 11/2003 |

OTHER PUBLICATIONS

Notification of Filing Examination Opinion mailed by the Chinese Patent Office on Oct. 28, 2008.

* cited by examiner

*Primary Examiner*—Edwin A. Leon
*Assistant Examiner*—Vanessa Girardi
(74) *Attorney, Agent, or Firm*—Knobbe, Martens, Olson & Bear LLP

(57) ABSTRACT

An electronic device, comprising an improved printed circuit board connection for connecting a first printed circuit board to a second printed circuit board in a manner that permits physical engagement at a different position than the electrical engagement, and a method for making the improved printed circuit board connection with precision in alignment. In one embodiment, the first printed circuit board includes an end portion configured to engage with a member of a connector on the second printed circuit board. The end portion and the member engage along concave portions of the end portion and convex portions of the member. When engaged, the end portion and the member align wires of the first printed circuit board with terminals of the connector.

10 Claims, 6 Drawing Sheets

Example where terminals of FPC connector are of staggered type

Example where terminals of FPC connector are of straight type

Example where terminals of FPC connector are of staggered type

PRINTED CIRCUIT BOARD CONNECTION

CROSS-REFERENCE TO RELATED APPLICATIONS

This is a continuation of U.S. patent application Ser. No. 11/432,132, filed May 11, 2006, which is based upon and claims the benefit of priority from Japanese Patent Application No. 2005-138698, filed May 11, 2005, the entire contents of which are incorporated herein by reference.

BACKGROUND OF THE INVENTION

1. Field of the Invention

One embodiment of the invention relates to a circuit board, such as a flexible printed circuit board or rigid printed circuit board, a connector connectable to the circuit board, and an electronic device with the circuit board and connector.

2. Description of the Related Art

In accordance with the development of downsizing and high integration of electronic devices, the electronic units incorporated in the electronic devices are also reduced in size. Similarly, reduction in size and pitch, high integration and high accuracy are required of flexible printed circuit (FPC) boards for connecting the electronic units, and connectors (FPC connectors) connected to the FPCs.

For instance, to appropriately mount an FPC on an FPC connector, their outlines are processed for positioning. Outline processing is often performed on the opposite ends of the FPC (the opposite ends that are brought into contact with the insertion hole of the FPC connector when the FPC is inserted therein). In this case, the outlines of the opposite ends must be processed highly accurately so as to prevent contact failure from occurring at the opposite ends.

Jpn. Pat. Appln. KOKAI Publication No. 2003-317830 (see, for example, FIG. 8) discloses a structure in which two boards have respective projecting contact portions, through which the wiring patterns of the boards are coupled to each other.

In general, the outline processing of the opposite ends of an FPC is performed after wiring is formed on the FPC, and may well cause errors. Even a slight error may cause the contact position to be greatly deviated from the correct position on a highly integrated narrow-pitch FPC wiring pattern, thereby causing electrical contact failure. This may occur in rigid printed circuit boards, as well as in FPCs.

Further, in the above-mentioned structure in which two boards have respective projecting contact portions, through which their wiring patterns are coupled to each other, electrical contact failure may easily occur because of the influence of dust or adhesive, etc. When a clearance is defined between the boards, contact failure may also easily occur.

BRIEF DESCRIPTION OF THE DRAWINGS

A general architecture that implements the various feature of the invention will now be described with reference to the drawings. The drawings and the associated descriptions are provided to illustrate embodiments of the invention and not to limit the scope of the invention.

DETAILED DESCRIPTION OF THE PREFERRED EMBODIMENT

Various embodiments according to the invention will be described hereinafter with reference to the accompanying drawings. In general, according to one embodiment of the invention, there is provided an improved printed circuit board connection for connecting a first printed circuit board to a second printed circuit board in a manner that permits physical engagement at a different position than the electrical engagement, and a method for making the improved printed circuit board connection with precision alignment. In one embodiment, the first printed circuit board includes an end portion configured to engage with a member of a connector on the second printed circuit board. The end portion and the member engage along concave portions of the end portion and convex portions of the member. When engaged, the end portion and the member align wires of the first printed circuit board with terminals of the connector.

Figure 1:
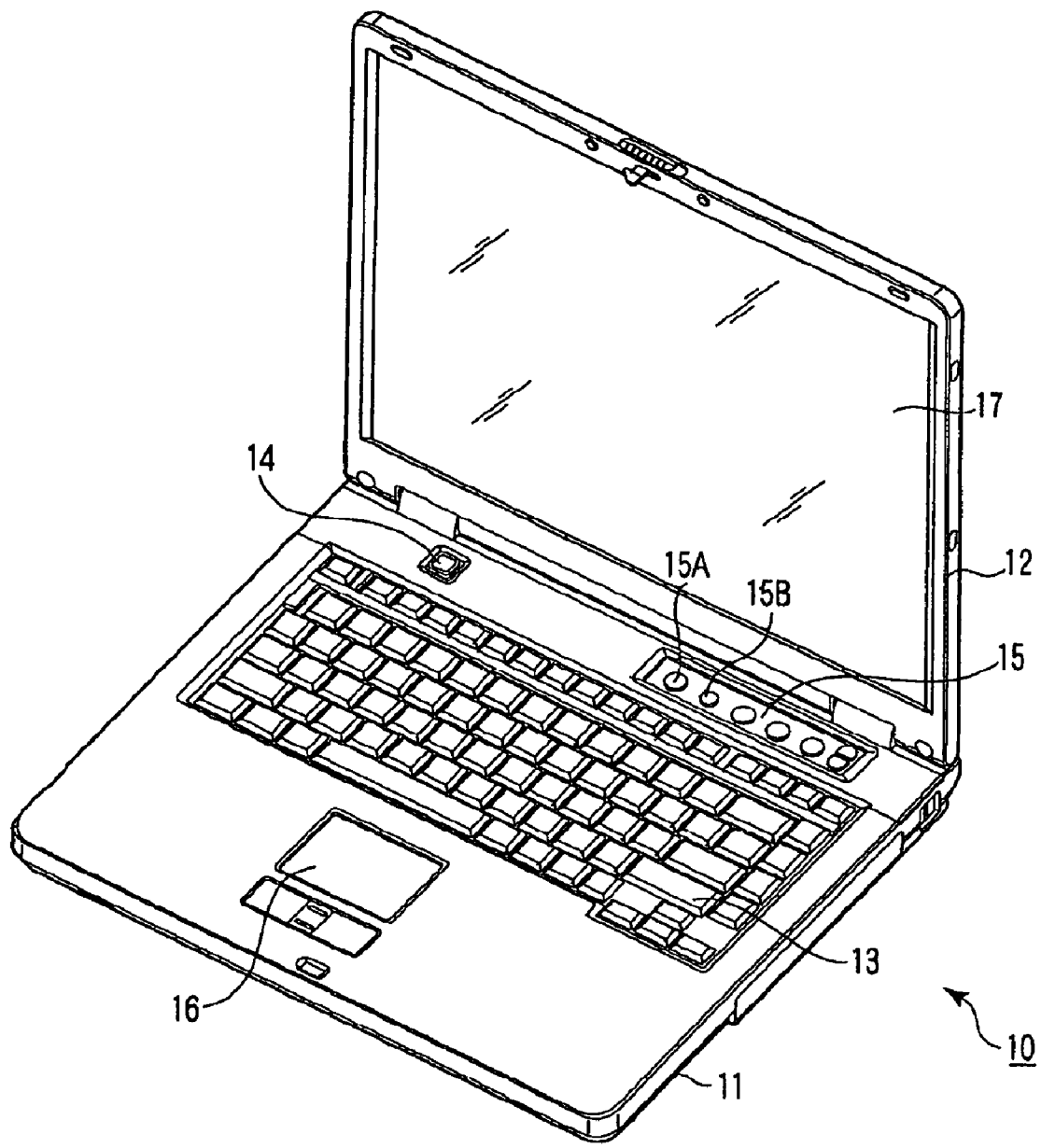
FIG. 1 is an exemplary schematic perspective view illustrating the outward appearance of an electronic device according to an embodiment of the invention.
Figure 2:
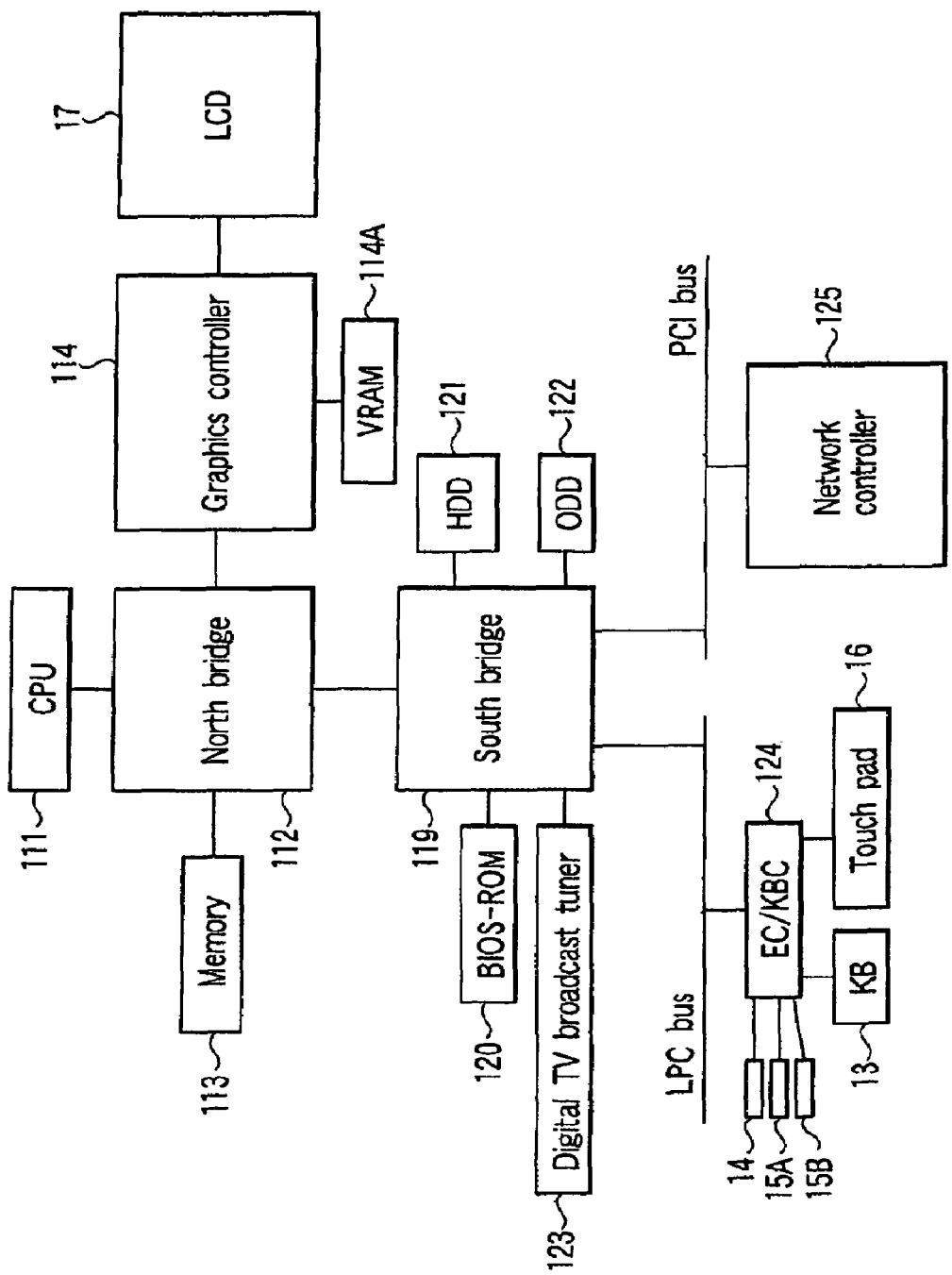
FIG. 2 is an exemplary block diagram illustrating the system configuration of the electronic device of FIG. 1.

Referring first to FIGS. 1 and 2, an electronic device according to the embodiment of the invention will be described. This electronic device is realized as, for example, a notebook personal computer 10.

FIG. 1 is a perspective view illustrating the notebook personal computer 10 in an open state. The computer 10 comprises a personal computer (PC) proper 11 and display unit 12. The display unit 12 incorporates a liquid crystal display (LCD) 17, and the display screen of the LCD 17 is positioned at substantially the center of the display unit 12.

The display unit 12 is attached to the PC proper 11 so that it can pivot between its open position and closed position. The PC proper 11 has a thin box-shaped case, and includes a keyboard 13, a power button 14 for turning on and off the computer 10, an input operation panel 15 and a touch pad 16, etc., which are provided on the upper surface of the case.

The input operation panel 15 is an input device for inputting an event corresponding to a button pushed, and includes a plurality of buttons for activating a plurality of functions. These buttons include a TV activation button 15A and digital versatile disc (DVD) activation button 15B. The TV activation button 15A is used to activate a TV function for recording and replaying broadcast program data, such as digital TV broadcast programs. When a user has pushed the TV activation button 15A, an application program for executing the TV function is automatically activated. The DVD activation button 15B is used to replay video content recorded on a DVD. When the user has pushed the DVD activation button 15B, an application program for replaying video content is automatically activated.

Referring to FIG. 2, the system configuration of the computer 10 will be described.

As shown in FIG. 2, the computer 10 comprises a CPU 111, north bridge 112, main memory (memory module) 113, graphics controller (module) 114, south bridge 119, BIOS-ROM 120, hard disk drive (HDD) 121, optical disk drive (ODD) 122, digital TV broadcast tuner (module) 123, embedded controller/keyboard controller IC (EC/KBC) 124 and network controller 125, etc.

The CPU 111 is a processor for controlling the entire operation of the computer 10, and executes an operating system (OS) and various application programs, such as a video replay application program, which are loaded from the HDD 121 to the main memory 113.

The CPU 111 also executes the basic input-output system (BIOS) stored in the BIOS-ROM 120. The BIOS is a program for hardware control.

The north bridge 112 is a bride device for connecting the local bus of the CPU 111 to the south bridge 119. The north bridge 112 contains a memory controller for controlling access to the main memory 113. The north bridge 112 also has a function for communicating with the graphics controller 114 via, for example, an accelerated graphics port (AGP) bus.

The graphics controller 114 is a display controller for controlling the LCD 17 used as a display monitor for the computer 10. The graphics controller 114 generates a display signal, to be sent to the LCD 17, from image data written in a video memory (VRAM) 114A.

The south bridge 119 controls each device on a low pin count (LPC) bus, and each device on a peripheral component interconnect (PCI) bus. The south bridge 119 contains an integrated drive electronics (IDE) controller for controlling the HDD 121 and ODD 122, and also has a function for controlling the digital TV broadcast tuner 123, and a function for controlling access to the BIOS-ROM 120.

The HDD 121 is a storing unit for storing various types of software and data. The optical disk drive (ODD) 122 is a drive unit for driving a data storing media, such as a DVD, which stores video content. The digital TV broadcast tuner 123 is a receiver for receiving broadcast program data, such as digital TV broadcast programs, from the outside.

The embedded controller/keyboard controller IC (EC/KBC) 124 is a one-chip microcomputer including an embedded controller for power management, and a keyboard controller for controlling the keyboard (KB) 13 and touch pad 16. The embedded controller/keyboard controller IC (EC/KBC) 124 has a function for turning on and off the computer 10 in accordance with the operation of the power button 14 by the user. The network controller 125 is a communication device for enabling communication with an external network, such as the Internet.

Figure 3:
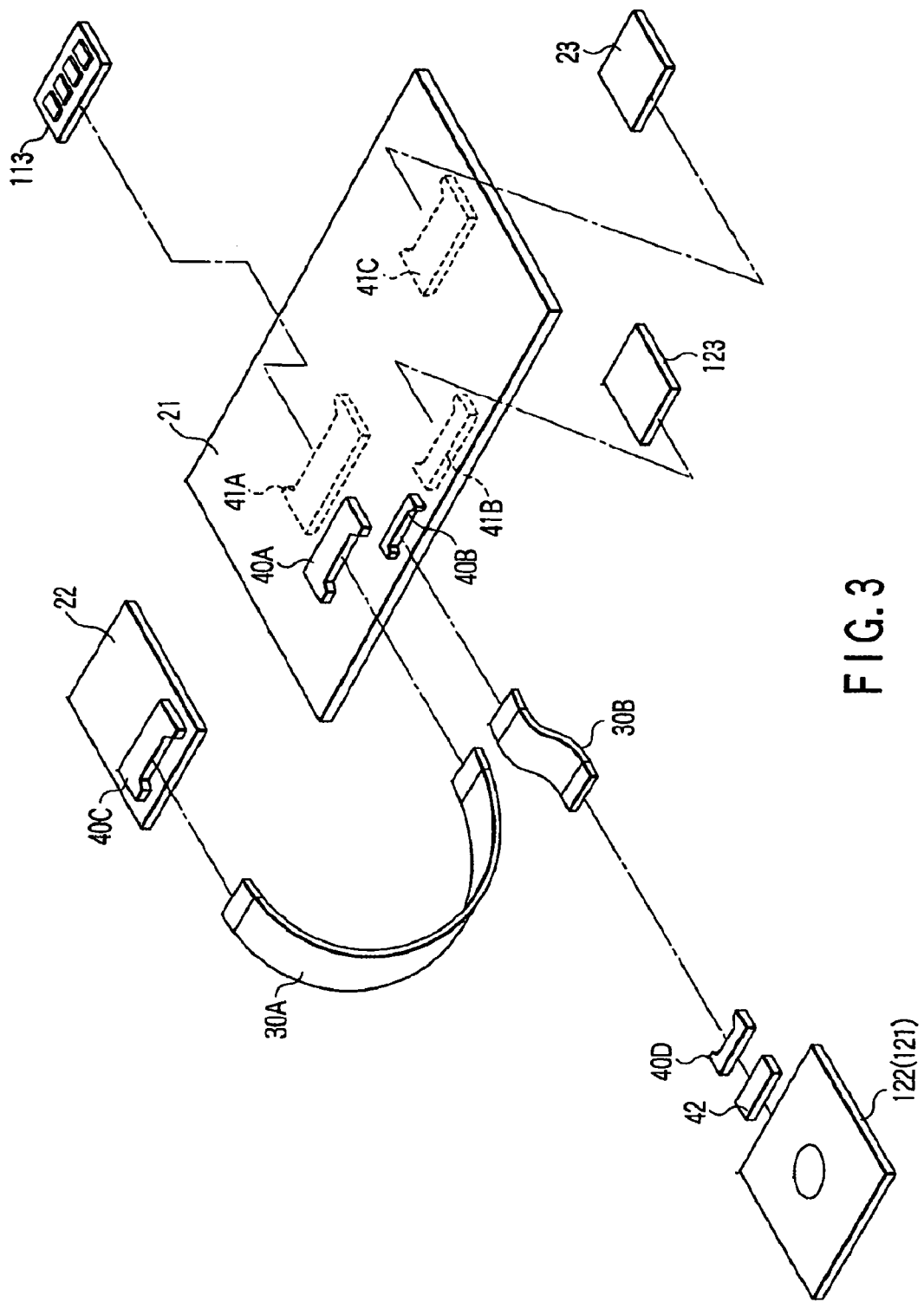
FIG. 3 is an exemplary development useful in explaining the structural elements related to various types of printed circuit boards employed in the electronic device of FIG. 1.

FIG. 3 is a development useful in explaining the structural elements related to various types of printed circuit boards for use in the computer 10.

The computer 10 contains a main board (main PCB) 21. On the main PCB 21, there are provided FPC connectors 40A and 40B for mounting flexible printed circuit boards (FPCs) 30A and 30B that interface units with each other, and connectors (or sockets) 41A and 41B for mounting various modules provided with rigid printed circuit boards.

As well as the main PCB 21, a sub PCB 22 and mini-PCB module 23 are contained in the computer 10. An FPC connector 40C for fixing the FPC 30B is attached to the sub PCB 22.

In the example of FIG. 3, each connector is of a right angle type (i.e., a lateral mount type in which the corresponding printed circuit board is inserted perpendicularly to the direction in which each connector is mounted on the main PCB 21). However, each connector is not limited to this type, and may be of a straight type (i.e., a longitudinal mount type in which the corresponding printed circuit board is inserted in the same direction in which each connector is mounted on the main PCB 21).

The FPCs 30A and 30B are flexible printed circuit boards in which a circuit formed by accurately etching, for example, copper foil is sandwiched between polyimide films excellent in insulation and heat resistance. Each FPC is electrically connectable to the corresponding FPC connectors when the opposite end portions of each FPC are inserted into insertion slits formed in the connectors.

The FPC 30A has its one end portion connected to the FPC connector 40A provided on the main PCB 21, and the other end portion connected to the FPC connector 40C provided on the sub PCB 22, and serves as an interface between the main PCB 21 and sub PCB 22. The FPC 30B has its one end portion connected to the FPC connector 40B provided on the main PCB 21, and the other end portion connected to the FPC connector 40D provided at the optical disk drive (ODD) 122, and serves as an interface between the main PCB 21 and ODD 122. The FPC connector 40D is connected to the ODD 122 via a connector 42. The same way of connection as that of the ODD 122 may be employed for the HDD 121.

The memory module 113, digital TV broadcast tuner module 123 and mini-PCB module 23 are fitted in the connectors 41A, 41B and 41C, respectively. Each module is provided with a rigid printed circuit board. The rigid circuit board is not so flexible as the FPC. When an end portion of each rigid printed circuit board is inserted into, for example, an insertion slit formed in the corresponding connector, each circuit board is electrically connectable to the corresponding connector. The same way of connection as that of the modules 112, 123 and 23 may be employed for the graphics controller module 114.

Figure 4:
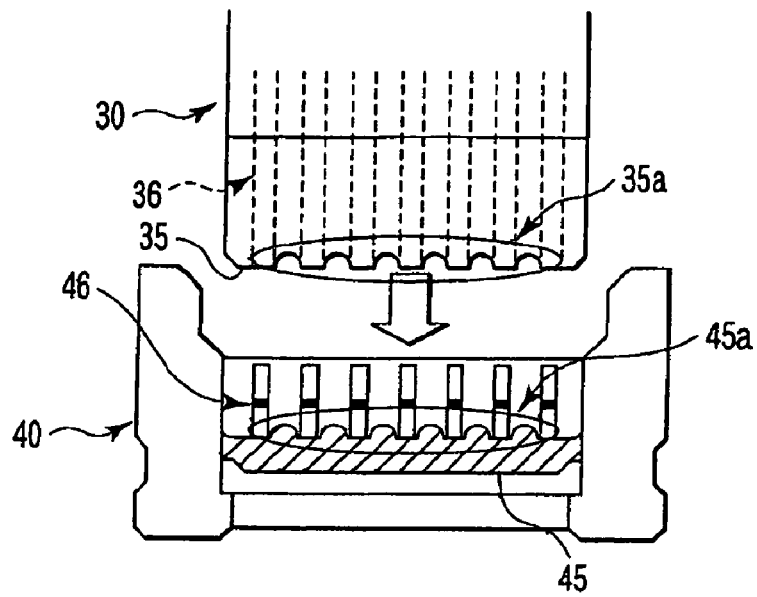
FIG. 4 is an exemplary view illustrating a first structural example of the connecting portion between the FPC of FIG. 3 and an FPC connector.
Figure 5:
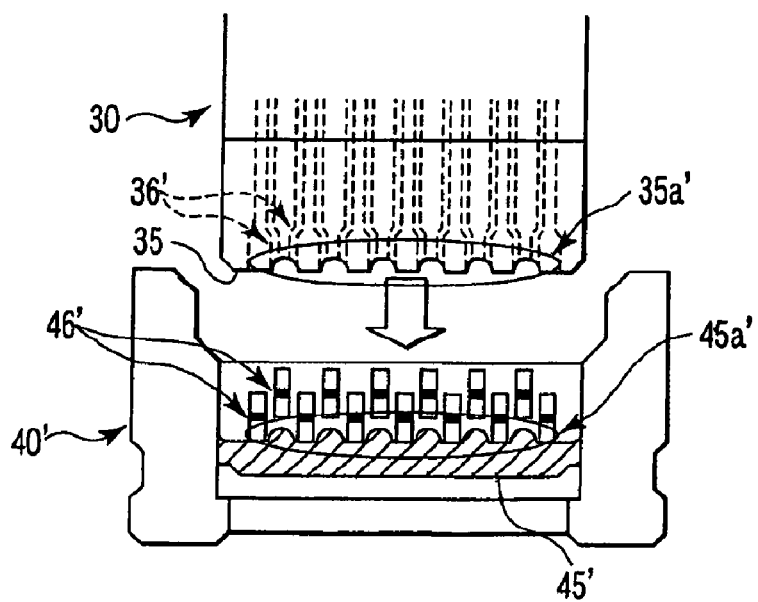
FIG. 5 is an exemplary view illustrating a second structural example of the connecting portion between the FPC of FIG. 3 and an FPC connector.

FIGS. 4 and 5 show examples of connections between each FPC and the corresponding FPC connector shown in FIG. 3. Namely, the structure shown in FIG. 4 or 5 is employed in the connections between the FPC 30A and FPC connector 40A, between the FPC 30A and FPC connector 40C, between the FPC 30B and FPC connector 40B, and between the FPC 30B and FPC connector 40D. FIG. 4 shows a case where the terminal arrangement of each FPC connector is of a straight type, and FIG. 5 shows a case where the terminal arrangement of each FPC connector is of a staggered type.

Figure 6:
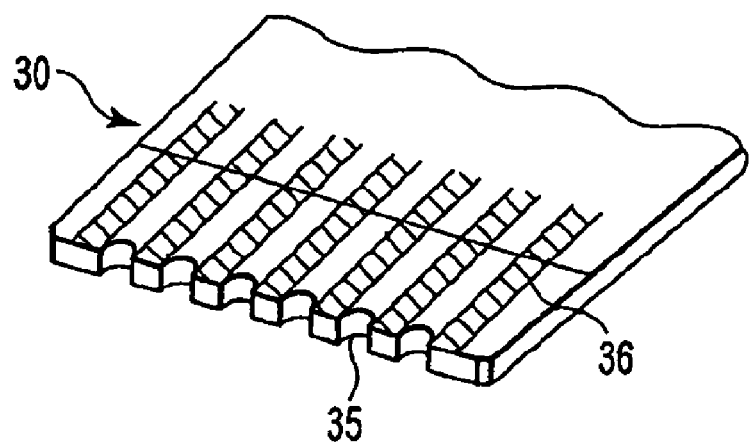
FIG. 6 is an exemplary perspective view acquired when the FPC of FIG. 4 is viewed in a different direction.
Figure 7:
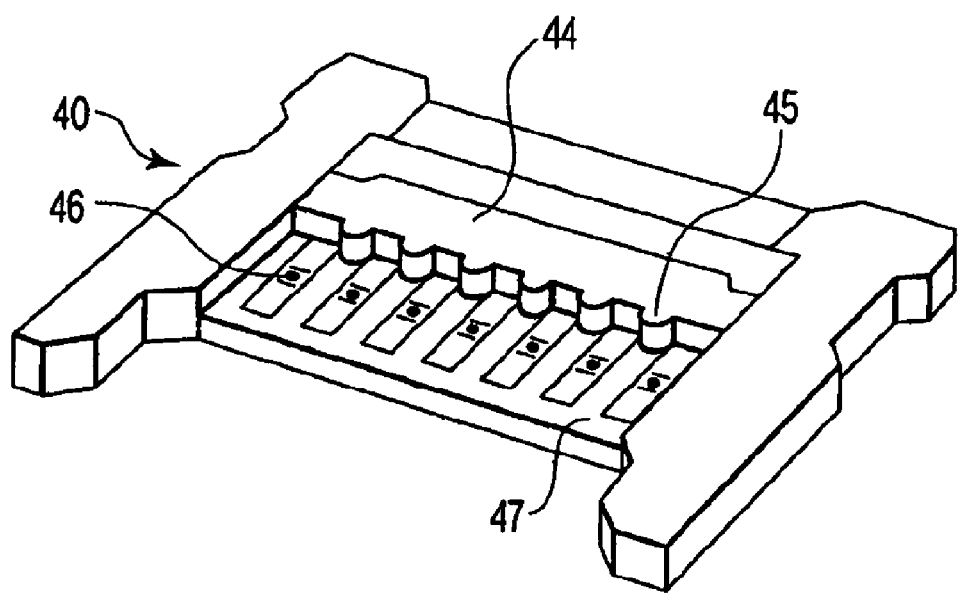
FIG. 7 is an exemplary perspective view acquired when the FPC connector of FIG. 4 is viewed in a different direction.

FIG. 6 is a view acquired when the FPC 30 of FIG. 4 is viewed in a different direction. FIG. 7 is a view acquired when the FPC connector 40 of FIG. 4 is viewed in a different direction. Specifically, FIG. 6 shows a state in which the reverse surface (the surface provided with wiring 36) of the FPC 30 in FIG. 4 is directed upwardly. In FIG. 7, although it appears that nothing exists above a plate member 47, another plate member actually exists which cooperates with the plate member 47 to hold therebetween the FPC 30 fitted in the FPC connector 40. This provides an insertion slit for inserting the FPC 30 therein, and a housing structure for covering the inserted FPC 30.

The FPC 30 in FIG. 4 corresponds to each of the FPC 30A and 30B in FIG. 3. Further, the FPC connector 40 in FIG. 4 corresponds to each of the FPC connectors 40A, 40B and 40C.

The FPC connector 40 is of, for example, a right angle type, and employs a contact form called "downside contact" in relation to the electrical connection of the FPC 30. Further, the FPC 30 is of a type corresponding to the contact form.

The FPC connector 40 has a member 45 engaged with an end portion 35 of the FPC 30 when the FPC 30 is fitted in the connector. The FPC connector 40 also has a plurality of terminals 46 (formed of, for example, metal plate springs) electrically connectable to a plurality of wires 36, incorporated in the FPC 30, at different positions from the end portion 35 of the FPC 30 via their respective contacts when the member 45 is engaged with the end portion 35.

The FPC 30 has the end portion 35 engaged with the member 45 of the FPC connector 40 when it is fitted in the FPC connector 40. Further, the FPC 30 also has the plurality of wires 36 electrically connectable to the plurality of terminals 46 of the FPC connector 40 at different positions from the end portion 35 of the FPC 30 via their respective contacts when the end portion 35 is engaged with the member 45 of the FPC connector 40. Assume here that the wires 36 are provided on the lower surface of the FPC 30 in the form of a copper pattern.

In particular, in the embodiment, the member 45 of the FPC connector 40 has a plurality of semicircular convex portions 45a, while the end portion 35 of the FPC 30 has a plurality of semicircular concave portions 35a. The semicircular convex portions 45a and concave portions 35a are engaged to position the wires 36 and terminals 46.

The semicircular concave portions 35a are formed through a drilling process on a PCB to acquire circular holes, and processing the circular holes into semicircular ones (e.g., by removing the portion of the PCB that ranges from the center of the holes to the edge of the PCB). Thus, concave portions of highly positioning accuracy can be formed at low cost, simply using an existing way of drilling. Further, the problem of displacement can be avoided by performing the drilling process before forming the wires 36. Namely, the wires 36 are formed after forming circular holes by drilling. In this case, the positions of the wires 36 are determined with reference to the positions of the circular holes.

On the other hand, part of the member 45 is formed into the semicircular convex portions 45a by molding. By virtue of molding, the convex portions 45a accurately engaged with the semicircular concave portions 35a can be easily formed. After forming the member 45 with the convex portions 45a, the terminals 46 are formed. At this time, the positions of the terminals 46 are determined from the positions of the semicircular convex portions 45a.

If the number of the concave portions 35a and 45a is set equal to that of the wires 36 and terminals 46, positioning can be performed in units of terminals, which realizes more reliable positioning. However, the number is not limited to the above. For instance, the number of the concave portions 35a and 45a may be reduced to half, or to two at minimum. Even in such cases, reliable positioning can be realized.

The structures of FIGS. 4 and 5 differ in two points. The first point is that the terminals 46 in FIG. 4 are arranged in a straight manner, while the terminals 46' in FIG. 5 are arranged in a staggered manner. The second point is that the wires 36 in FIG. 4 are arranged in a straight manner in accordance with the arrangement of the terminals 46, while the wires 36' in FIG. 5 are arranged in a staggered manner in accordance with the arrangement of the terminals 46'.

The structures shown in FIGS. 4 to 7 are also applicable to FPCs (not shown) contained in (for example, a head section repeatedly operating at high speed and incorporated in) the ODD 122 or HDD 121 in FIG. 3.

Further, the structures of FIGS. 4 to 7 are also applicable to the rigid printed circuit boards and corresponding connectors in FIG. 3. Namely, the structure shown in FIG. 4 or 5 can be employed in the connections between the memory module 113 and connector 41A, between the digital TV broadcast tuner module 123 and connector 41B, and between the mini-PCB module 23 and connector 41C.

Figure 8:
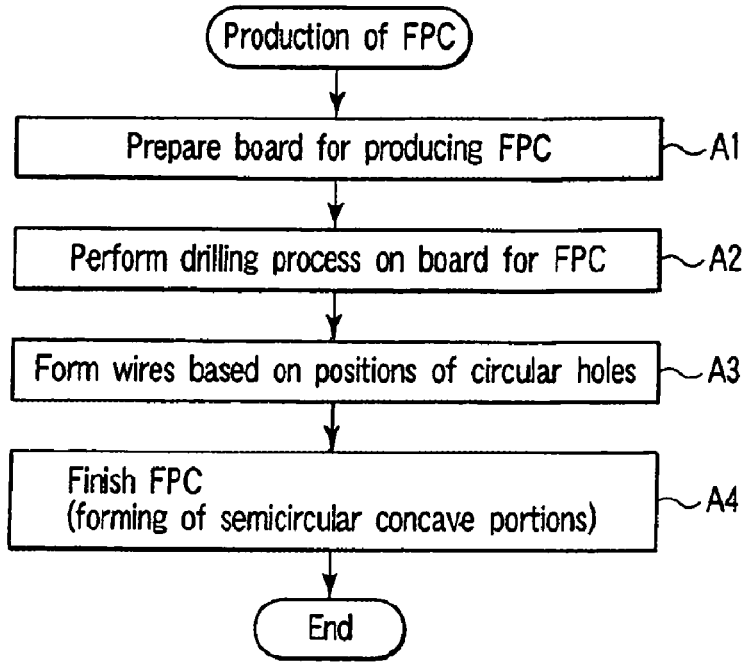
FIG. 8 is an exemplary flowchart useful in explaining the procedure of producing the FPC.

Referring then to FIG. 8, the procedure of manufacturing an FPC will be described briefly.

Firstly, a copper-coated plate or copper-coated laminated plate for producing an FPC is prepared (block A1). A drilling process is performed on the copper-coated plate or copper-coated laminated plate for connecting the upper and lower surfaces thereof or the upper, inner and lower surfaces thereof, and another drilling process is performed for forming such semicircular concave portions as described above (block S2). As a result, a plurality of circular holes is formed. After that, with reference to the positions of the circular holes, a plurality of wires are formed on the copper-coated plate or copper-coated laminated plate (block A3). Lastly, outline processing is executed on the resultant structure to finish an FPC as a final product. By outline processing, the circular hole portions formed by drilling are formed into semicircular hole portions (block A4).

Figure 9:
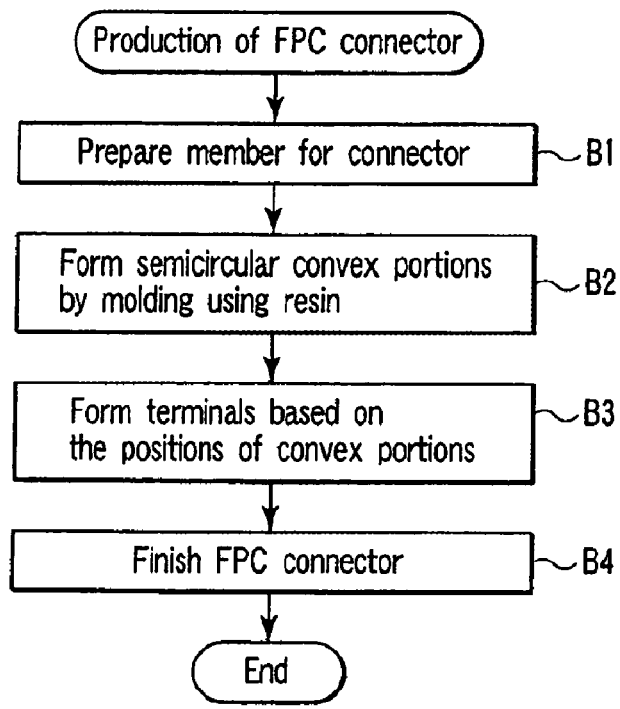
FIG. 9 is an exemplary flowchart useful in explaining the procedure of producing the FPC connector.

Referring to FIG. 9, the procedure of manufacturing an FPC connector will be described briefly.

Firstly, components and materials for the FPC connector are prepared (block B1). Subsequently, molding is performed using, for example, a resin to form semicircular convex portions (block B2). After that, a plurality of terminals are formed with reference to the positions of the already formed semicircular convex portions (block B3), and lastly, an FPC connector as a final product is finished (block B4).

The procedures of FIGS. 8 and 9 are also applicable to the production of each rigid printed circuit board and the corresponding connector.

As described above, in the embodiment, a plurality of semicircular convex portions are formed at each connector, and a plurality of semicircular concave portions are formed at the corresponding printed circuit board to be fitted in each connector, thereby realizing highly accurate positioning to prevent contact failure during the connection of the connector and board.

Although each connector employed in the embodiment is of the right angle type and downside-contact type, the convex structure is applicable to various types of connectors, such as a connector of the right angle type and upside-contact type, a connector of the right angle type and upside/downside-contact type, a connector of a straight type and right-hand-contact type, a connector of the straight type and left-hand-contact type, and a connector of the straight type and right-hand/left-hand-contact type. Further, the concave structure is also applicable to printed circuit boards fitted in these connectors.

In addition, although in the embodiment, the electronic device is a personal computer, the connector and printed circuit board for connecting units are also applicable to other types of electronic devices, such as PDAs, mobile phones, liquid crystal television sets, plasma television sets, mobile audio players, digital cameras and portable players.

As described above in detail, it is possible to realize highly accurate positioning to prevent contact failure.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device, comprising:
a connector comprising a member and terminals;
a printed circuit board comprising an end portion and conductors;
the member being configured to engage the end portion of the printed circuit board, the member comprising a plurality of substantially convex portions that are configured to align with the conductors on the printed circuit board when the member is engaged with the end portion, each of the substantially convex portions being semicircular;
the terminals being configured to be in electrical communication with the conductors at positions different from the member when the member is engaged with the end portion, each of the substantially convex portions being positioned between adjacent ones of the terminals;
the end portion being configured to engage the member of the connector, the end portion comprising substantially concave portions that are configured to align with the terminals on the connector when the end portion is engaged with the member, each of the substantially concave portions being semicircular; and
the conductors being configured to be in electrical communication with the terminals at positions different from the end portion when the end portion is engaged with the member, each of the substantially concave portions being positioned between adjacent ones of the terminals when the end portion is engaged with the member.

2. The electronic device of claim 1, wherein the substantially concave portions comprise drilled surfaces.

3. The electronic device of claim 1, wherein positions of the plurality of conductors are determined with reference to positions of the substantially concave portions.

4. The electronic device of claim 1, wherein the printed circuit board is a flexible printed circuit board.

5. The electronic device of claim 1, wherein the printed circuit board is a rigid printed circuit board.

6. The electronic device of claim 1, wherein at least part of the member comprises molded substantially convex portions.

7. The electronic device of claim 1, wherein positions of the plurality of terminals are determined with reference to positions of the substantially convex portions.

8. An electronic device, comprising:
a connector comprising a member and terminals;
a flexible printed circuit board comprising an end portion and conductors;
the member being configured to engage the end portion of the flexible printed circuit board, the member comprising a plurality of substantially convex portions that are configured to align with the conductors on the flexible printed circuit board when the member is engaged with the end portion, each of the substantially convex portions being semicircular;
the terminals being configured to be in electrical communication with the conductors at positions different from the member when the member is engaged with the end portion, each of the substantially convex portions being positioned between adjacent ones of the terminals;
the end portion being configured to engage the member of the connector, the end portion comprising substantially concave portions that are configured to align with the terminals on the connector when the end portion is engaged with the member, each of the substantially concave portions being semicircular;
the conductors being configured to be in electrical communication with the terminals at positions different from the end portion when the end portion is engaged with the member, each of the substantially concave portions being positioned between adjacent ones of the terminals when the end portion is engaged with the member; and
the flexible printed circuit board being flexed when the end portion of the flexible printed circuit board is engaged with the member of the connector.

9. The electronic device of claim 8, further comprising first and second connectors each having same structures as said connector,
the flexible printed circuit board being flexed when a first end portion of the flexible printed circuit board is engaged with a member of the first connector and a second end portion of the flexible printed circuit board is engaged with a member of the second connector.

10. A connector, comprising:
a member configured to engage an end portion of a printed circuit board, and comprising a plurality of substantially convex portions configured to align with conductors on the printed circuit board when the member is engaged with the end portion, each of the substantially convex portions being semicircular; and
a plurality of terminals; wherein a portion of said plurality of terminals are configured to be in electrical communication with the conductors at positions different from the member when the member is engaged with the end portion, each of the substantially convex portions being positioned between adjacent ones of the remaining plurality of terminals.

* * * * *